(12) United States Patent
Pasquali

(10) Patent No.: US 11,404,971 B2
(45) Date of Patent: Aug. 2, 2022

(54) CONVERTER FOR CONVERTING AN ELECTROMAGNETIC WAVE IN A CONTINUOUS ELECTRIC CURRENT

(71) Applicant: GREEN ARISE LTD, Nicosia (CY)

(72) Inventor: Cesare Maria Mose Pasquali, Sant'Angelo in Vado (IT)

(*) Notice: Subject to any disclaimer, the term of this patent is extended or adjusted under 35 U.S.C. 154(b) by 266 days.

(21) Appl. No.: 16/769,524

(22) PCT Filed: Dec. 4, 2018

(86) PCT No.: PCT/IT2018/050236
§ 371 (c)(1),
(2) Date: Jun. 3, 2020

(87) PCT Pub. No.: WO2019/111287
PCT Pub. Date: Jun. 13, 2019

(65) Prior Publication Data
US 2020/0389097 A1 Dec. 10, 2020

(30) Foreign Application Priority Data
Dec. 4, 2017 (IT) .................. 102017000139615

(51) Int. Cl.
*H02M 7/06* (2006.01)
*H01Q 1/22* (2006.01)
(Continued)

(52) U.S. Cl.
CPC .............. *H02M 7/06* (2013.01); *H01L 31/04* (2013.01); *H01Q 1/2283* (2013.01);
(Continued)

(58) Field of Classification Search
CPC ....... H02M 7/06; H01L 31/04; H01Q 1/2283; H01Q 1/248; H01Q 9/27; H01Q 21/061;
(Continued)

(56) References Cited

U.S. PATENT DOCUMENTS 8,071,931 B2 * 12/2011 Novack ................ H01Q 21/061
250/208.2
8,847,824 B2 * 9/2014 Kotter .................... H01Q 1/248
343/795
(Continued)

FOREIGN PATENT DOCUMENTS

| JP | H09 199935 A | 7/1997 |
|----|--------------|--------|
| RU | 172089 U1 | 6/2017 |

OTHER PUBLICATIONS

Energy Harvesting Technologies. Shashank Priya and Daniel J. Inman—Editors (Year: 2009).*
(Continued)

*Primary Examiner* — Vibol Tan
(74) *Attorney, Agent, or Firm* — Knobbe Martens Olson & Bear LLP

(57) ABSTRACT

The present invention relates to a converter for converting an electromagnetic wave in a continuous electric current.

Particularly, said converter comprises at least one antenna and at least one rectifier for transforming said alternating electric current in a continuous electric current, where said at least one rectifier is connected in series to said antenna.

In particular, said antenna is configured to pick up an electromagnetic wave and resonate at the frequency of said electromagnetic wave, so as to generate an alternating electric current having a frequency equal to the frequency of said electromagnetic wave and said rectifier comprises a quantum diode for rectifying at high speed said alternating electric current.

15 Claims, 6 Drawing Sheets

(51) Int. Cl.
*H01L 31/04* (2014.01)
*H01Q 1/24* (2006.01)
*H01Q 9/27* (2006.01)
*H01Q 21/06* (2006.01)
*B82Y 10/00* (2011.01)

(52) U.S. Cl.
CPC ............... *H01Q 1/248* (2013.01); *H01Q 9/27* (2013.01); *H01Q 21/061* (2013.01); *B82Y 10/00* (2013.01)

(58) Field of Classification Search
CPC ....... B82Y 10/00; H02J 3/381; H02J 2300/24; H02J 2310/44; H02J 4/00; H02J 7/0068; H02J 2300/22; Y02E 10/56
See application file for complete search history.

(56) References Cited

U.S. PATENT DOCUMENTS

2014/0001363 A1 1/2014 Koyama
2015/0326322 A1 11/2015 Ben-Bassat

OTHER PUBLICATIONS

A flexible electromagnetic wave-electricity harvester. Hualiang Lv et al. (Year: 2021).*
Terahertz detection with an antenna-coupled highly-doped silicon quantum dot. Takuya Okamoto et al. (Year: 2019).*
RF power harvesting: a review on designing methodologies and applications. Le-Giang Tran et al. (Year: 2017).*
Search Report and Written Opinion; IT2017/00139615; dated Jul. 24, 2018; 9 pages.
PCT Search Report and Written Opinion; PCT/IT2018/050236; dated Mar. 26, 2019; 12 pages.
Kotter et. "Solar nantenna electromagnetic collectors", Proceedings of ES2008, Energy Sustainability 20081; Aug. 14, 2008; 8 pages.

* cited by examiner

CONVERTER FOR CONVERTING AN ELECTROMAGNETIC WAVE IN A CONTINUOUS ELECTRIC CURRENT

TECHNICAL FIELD

The present invention relates to a converter for converting an electromagnetic wave in a direct electric current.

More particularly, the invention relates the structure of said converter capable of converting natural and artificial electromagnetic waves in a continuous electric current, by which it is possible to supply power to any load which can be connected to said converter.

BACKGROUND

With the expression "electromagnetic waves" is intended electromagnetic waves with frequencies between 250 MHz e 750 THz, i.e. electromagnetic waves with a wavelength between 1 mm and 400 nm (namely the spectrum comprising microwave, infrared, visible and ultraviolet)

In other words, reference will be made to electromagnetic wave with frequencies belonging to the infrared spectrum, electromagnetic waves with frequencies belonging to the visible spectrum and to electromagnetic waves with frequencies belonging to the ultraviolet spectrum, close to the frequencies belonging to the visible spectrum.

With natural electromagnectic waves is intended electromagnetic waves of terrestrial and cosmic origin (comprising also the electromagnetic waves coming from the sun).

For example, the light coming from the sun is a collection of electromagnetic waves which, in terms of optical spectrum, have wavelengths belonging to the infrared spectrum, to the visible spectrum and to the ultraviolet spectrum.

The cosmic electromagnetic waves come from the space (particularly from the sun) and are constituted, beside the particles, by X rays and gamma rays, as well as electromagnetic waves with frequence between hundreds of MHz and hundreds of THz.

With artificial electromagnetic waves is intended electromagnetic waves artificially generated through signals with respective carriers to be received from radio-TV devices, electronic mobile devices, or by any electrical or electronic equipment of residential, industrial or individual use.

Currently, there are not known converters for converting electronic waves in a continuous electric current.

On the contrary there is known an electromagnetic collector disclosed in the publication in the name Kotter et al titled "Solar antenna electromagnetic collectors", Proceedings of ES2008, Energy Sustainability 2008, 14 Aug. 2008.

Said electromagnetic collector is able to detect the wavelengths of the electromagnetic spectrum and to convert solar energy in electric energy.

In particular, said converter is constituted by nanoantennas capable of resonating at predetermined wavelengths and by tunnel diodes for rectifying the alternating electric current.

However, said electromagnetic collector have some disadvantages.

A disadvantage is given by the fact that said electromagnetic collector is not able to provide a continuous electric current, stable over the time.

A further disadvantage is given by the fact that the structure is complex, with the resulting manufacturing costs

SUMMARY

Aim of the present invention is overcome said disadvantages providing a converter for converting an electromagnetic wave in a continuous electric current, having a simple structure and a low cost.

Advantageously, any load connected to said converter can be powered from the continuous electric current generated by said converter.

A further aim of the present invention is given by the fact that said converter is capable of rectifying at high speed the alternating electric current in a continuous electric current.

It is therefore object of the invention a converter for converting an electromagnetic wave with a wavelength between 1 mm and 400 nm in a continuous electric current, where said converter comprises:

at least one antenna configured to pick up an electromagnetic wave and resonate at the frequency of said electromagnetic wave, so as to generate an alternating electric current having a frequency equal to the frequency of said electromagnetic wave, at least one rectifier for transforming said alternating electric current into a continuous electric current, where said at least one rectifier is connected in series to said antenna.

With reference to the antenna, said antenna comprises:

a dielectric layer having a thickness equal to one quarter of the wavelength of said electromagnetic wave, a conductive layer of metal material.

With reference to the rectifier, said rectifier comprises a quantum diode, where said quantum diode comprises:

a first dielectric layer comprising a first surface and a second surface, opposite to said first surface, said first dielectric layer having a thickness equal to a quarter of the wavelength of said electromagnetic wave, a first electrode or cathode made of a first metal material, different from the metal material of the conductive layer of said antenna, where said first electrode is partially in contact with the first surface of said first dielectric layer and partially in contact with said antenna; in cross section said first electrode has a first height and has a first side with a first end, in contact with the first surface of the first dielectric layer, and a second end, opposite to said first end, a second side with a first end in contact with the first surface of the first dielectric layer, and a second end, opposite said first end, and well as a third side connecting the second end of said first side to the second end of said second side, where said third side has a first end in contact with the second end of said first side in such a way that said first side and said third side have a contact point, a second dielectric layer comprising a first part, where said first part comprises a first portion in contact with a portion of said third side of said first electrode, a second portion in contact with said first side of said first electrode, and a third portion in contact with a portion of the first surface of said first dielectric layer, a second electrode or anode made of a second metal material, equal to the metal material of said antenna, partially in contact with the first part of said second layer dielectric, so that said second electrode is separated from said first electrode by said first part of said second dielectric layer; in cross section said second electrode has a second height, greater than the first height of said first electrode, In particular, said first side and said third side are arranged in such a way that they form an angle greater than 0° and less than or equal to 90°, so that, when said antenna resonates at the frequency of the electromagnetic wave, a respective quantity of electrons moves from said first electrode to said second electrode, jumping for tunnel effect said second dielectric layer in correspondence of said contact point.

It is preferable that said angle is between 5° and 30°.

With reference to the second electric layer, said second electric layer can have a thickness ranging from 1.5 nm to 4 nm, preferably 2 nm.

Furthermore, said second dielectric layer can comprise a second part, spaced from said first part, comprising a first portion in contact with a further portion of said third side of said first electrode, a second portion in contact with said second side of said first electrode, a third portion in contact with a further portion of the first surface of said first dielectric layer.

In particular, the distance between said second part and said first part is between 70 nm and 100 nm.

The quantum diode can comprise a support layer, arranged in contact with the second surface of said first dielectric layer.

In a first alternative, said support layer of said quantum diode is made of a material selected from the following group: polycarbonate, polyethylene, polyester fabric, cycloolefin copolymers, preferably Topas.

In a second alternative, said support layer of said quantum diode is made of a material selected from the following group: glass, plexiglas.

In particular, with reference to the quantum diode, said first dielectric layer can be made of silicon dioxide, said first electrode can be made of chrome, said second dielectric layer can be made of dialuminium trioxide or hafnium dioxide, and said second electrode can be made of gold.

With reference to the antenna, the dielectric layer has a first surface and a second surface, opposite to said first surface.

In a first alternative, said antenna can comprise:

a reinforcing layer, in contact with the first surface of said dielectric layer, where said reinforcing layer is preferably made of chrome;

a support layer, in contact with the second surface of said dielectric layer, and said conductive layer is arranged in contact with said reinforcing layer, where said conductive layer is preferably made of gold.

In a second alternative, said conductive layer is arranged in contact with the first surface of said dielectric layer, where said conductive layer is preferably made of aluminum or copper.

With reference to the support layer of the antenna, said support layer can be made of a material selected from the following group: polycarbonate, polyethylene, polyester fabric, cycloolefin copolymers, preferably Topas.

With reference to the dielectric layer of the antenna, said dielectric layer can be made of silicon dioxide.

According to the invention, said antenna can comprise a first dipole and a second dipole and it is preferably a planar antenna.

Further according to the invention, the thickness of said antenna can be between 0.3 μm and 0.5 μm, preferably 0.3 μm.

BRIEF DESCRIPTION OF THE DRAWINGS

The present invention will be now described, for illustrative, but not limitative purposes, according to its embodiment, making particular reference to the enclosed figures, wherein.

DETAILED DESCRIPTION

Everywhere in this description and in the claims the case in which the term "comprises" is replaced by the term "consists of" is comprised.

Figure 1:
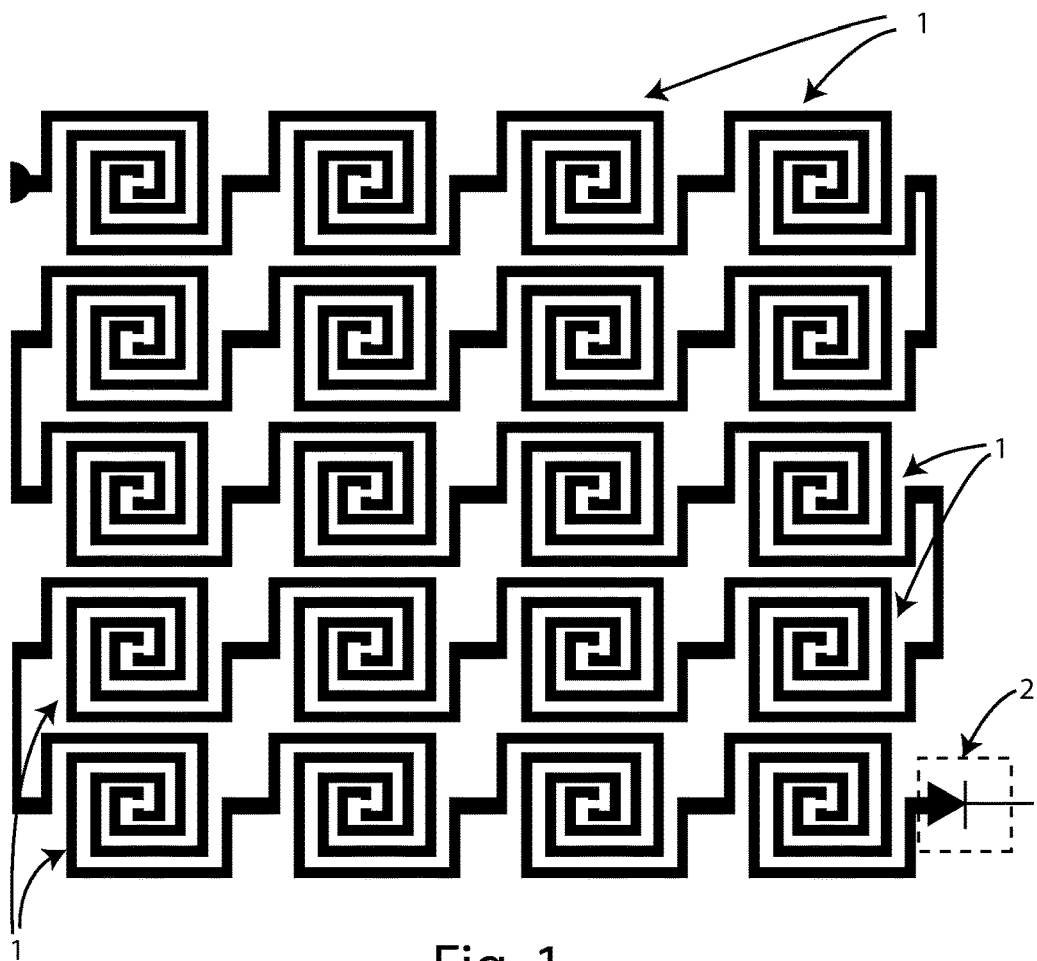
FIG. 1 is a schematic view of a first embodiment of a converter according to the invention, comprising a group of antennas and a rectifier, connected in series to said group of antennas, where the antennas of said group of antennas are connected in series to each other and each antenna is configured to resonate with a electromagnetic wave having a wavelength belonging to the infrared spectrum.

With particular reference to FIG. 1, a first embodiment of a converter for converting electromagnetic waves in a continuous electric current is described.

Said converter comprises:
- at least one antenna 1 configured to pick up an electromagnetic wave and resonate at the frequency of said electromagnetic wave, so as to generate an alternating electric current having a frequency equal to the frequency of said electromagnetic wave,
- at least one rectifier 2 for transforming said alternating electric current into a continuous electric current, where said at least one rectifier 2 is connected in series to said antenna.

In particular, in the embodiment being disclosed, said converter comprises a plurality of antennas connected in series sto each other.

In other words, said converter comprises a group of antennas which can comprise in turn one or more antennas.

With reference to the antennas 1, each antenna 1 comprises:
- a dielectric layer 110 (shown below with reference to FIG. 3) having a thickness equal to one quarter of the wavelength of said electromagnetic wave,
- a conductive layer 130,130' of metal material (shown below with reference to FIG. 3 and FIG. 4).

In the embodiment being disclosed, said group of antennas comprises sixteen antennas, arranged according to a matrix 4×4, and the rectifier 2 is connected in series to the antenna which occupies a position in said matrix identified by the fourth row and the fourth column.

In particular, each antenna comprises a first dipole 1A and a second dipole 1B.

Furthermore, the distance between the antennas arranged in a row of said matrix and the antennas arranged on a further row of said matrix, next to said row, is of 0.2 μm.

However, it is not necessary neither said group of antennas comprises sixteen antennas nor said antennas are arranged according to a matrix.

For example, said group of antennas can comprise a plurality of antennas in any number and arranged along an axis in such a way that they form a row, without departing from the scope of the invention.

Each of said antennas is configured to resonate with electromagnetic waves belonging to the infrared spectrum and having a wavelength equal to 155.08 μm (frequency approximately equal to 1.93 THz) and generate an alternating electric current having a frequency equal to the frequency of said electromagnetic waves.

Such antennas allow to pick up electromagnetic waves during the day and night, because infrared rays are present day and night.

Furthermore, each antenna 1 has a geometric structure substantially shaped in such a way that it forms a square spiral.

Figure 2A:
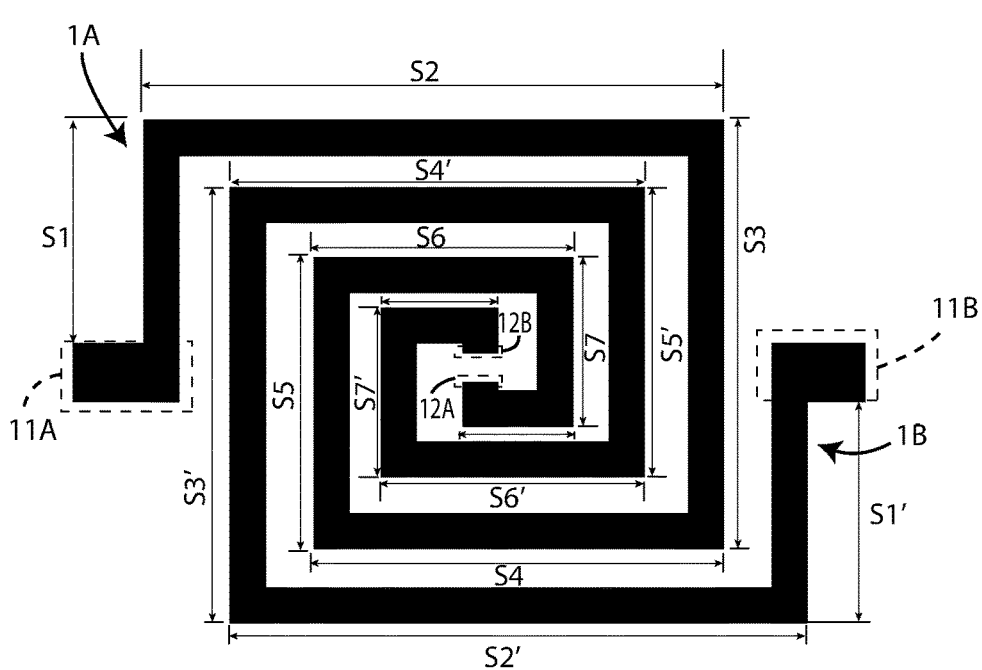
FIG. 2A is a schematic view o fan antenna of the group of antennas of the converter of FIG. 1, where said antenna has the shape of a square spiral and comprises a first dipole and a second dipole, each of which comprises a plurality of portions.

In fact, as can be seen in particular from FIG. 2A, said first dipole 1A and said second dipole 1B are arranged in such a way that they form substantially a square spiral.

In particular, said first dipole 1A and said second dipole 1B have respectively a first portion S1,S1', a second portion S2,S2', perpendicular to said first portion, a third portion S3,S3', perpendicular to said second portion, a fourth portion S4,S4', perpendicular to said third portion, a fifth portion S5,S5', perpendicular to said fourth portion, a sixth portion S6,S6', perpendicular to said fifth portion, a seventh portion S7,S7', perpendicular to said sixth portion, an eighth portion S8,S8', perpendicular to said seventh portion.

With reference to the first dipole 1A, the first portion S1 is parallel to the third portion S3, to the fifth portion S5 and to the seventh portion S7, and the second portion S2 is parallel to the fourth portion S4, to the sixth portion S6 and the eighth portio S8.

With reference to the second dipole 1B, the first portion S1' is parallel to the third portion S3', to the fifth portion S5' and to the seventh portion S7', and the second portion S2' is parallel to the fourth portion S4', to the sixth portion S6' and to the eighth portion S8'.

The two dipoles are arranged in such a way that the first portion S1 of the first dipole 1A is parallel to the first portion S1' of the second dipole 1B and that the second portion S2 of the first dipole 1A is parallel to the second portion S2' of the second dipole 1B.

In the first embodiment beng disclosed, the length of each dipole is 19,3887 μm and the antenna comprises a plurality of layers (as explained below) including a conductive layer in metal material, preferably in gold, having a thickness of 0.3 μm.

Figure 2B:
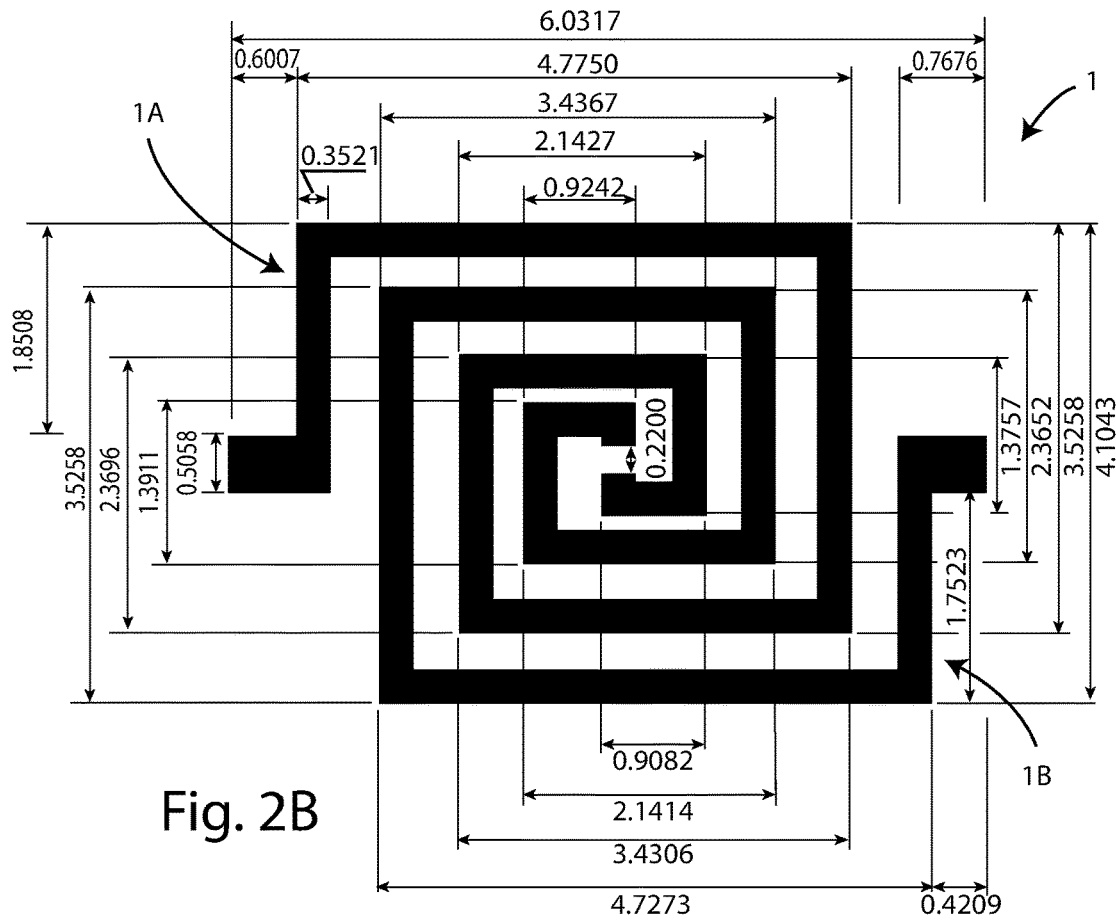
FIG. 2B is a schematic view of an antenna of the group of antennas of the converter of FIG. 1, in which the values of the lengths of each portion of the two dipoles being part of the antenna are shown.

FIG. 2B shows the lengths of each portion of the two antenna dipoles 1 of the group of the antennas.

All the values shows in FIG. 2B are espresse in μm.

With reference of the first dipole 1A, below the lengths of each portion:
- the length of the first portion S1 is 1.8508 μm
- the length of the second portion S2 is 4.775 μm
- the length of the third portion S3 is 3.5258 μm
- the length of the fourth portion S4 is 3.4306 μm,
- the length of the fifth portion S5 is 2.3696 μm,
- the length of the sixth portion S6 is 2.1427 μm,
- the length of the seventh portion S7 is 1.3757 μm,
- the length of the eighth portion S8 is 0.9082 μm.

With reference to the second dipole 1B, below the lengths of each portion:
- the length of the first portion S1' is 1.7523 μm,
- the length of the second portion S2' is 4.7273 μm,
- the length of the third portion S3' is 3.5258 μm
- the length of the fourth portion S4' is 3.4367 μm,
- the length of the fifth portion S5' is 2.3652 μm,
- the length of the sixth portion S6' is 2.1414 μm,
- the length of the seventh portion S7 is 1.3911 μm,
- the length of the eighth portion S8' is 0.9242 μm.

With reference to the width of said dipoles, the width of each portion of the first dipole is 0.3521 μm and is equal to the width of each portion of the second dipole.

Furthermore, the first 1° and the second dipole 1B have a respective first end 11A,11B and a respective second end 12A,12B.

The first end 11A of the first dipole 1A is connected to the first portion S1 of the first dipole itself and the second end 12A of the first dipole 1A is connected to the eighth portion S8 of the first dipole itself.

The length of the first end 11A is 0.9528 μm (0.6007 μm+0.3521 μm) and the width of the first end 11A is 0.5058 μm.

The first end 11B of the second dipole 1B is connected to the first portion S1' of the second dipole itself and the second end 12B of the second dipole 1B is connected to the eighth portion S8' of the second dipole itself.

The length of the first end 11B is 0.7676 μm and the width of the first end 11B is 0.5058 μm.

The second end 11B of the first dipole 1A of the antenna is facing the second end 12B of the second dipole 1B of the same antenna and the first end 11B of the second dipole 1B of said antenna is connected to the first end 11A of the first dipole 1A of a further antenna, arranged in succession and connected in series to said antenna, belonging to the same group of antennas.

The distance between the second end 12A of the first dipole 1A and the second end 12B of the second dipole 1B is 0.22 μm.

Figure 2C:
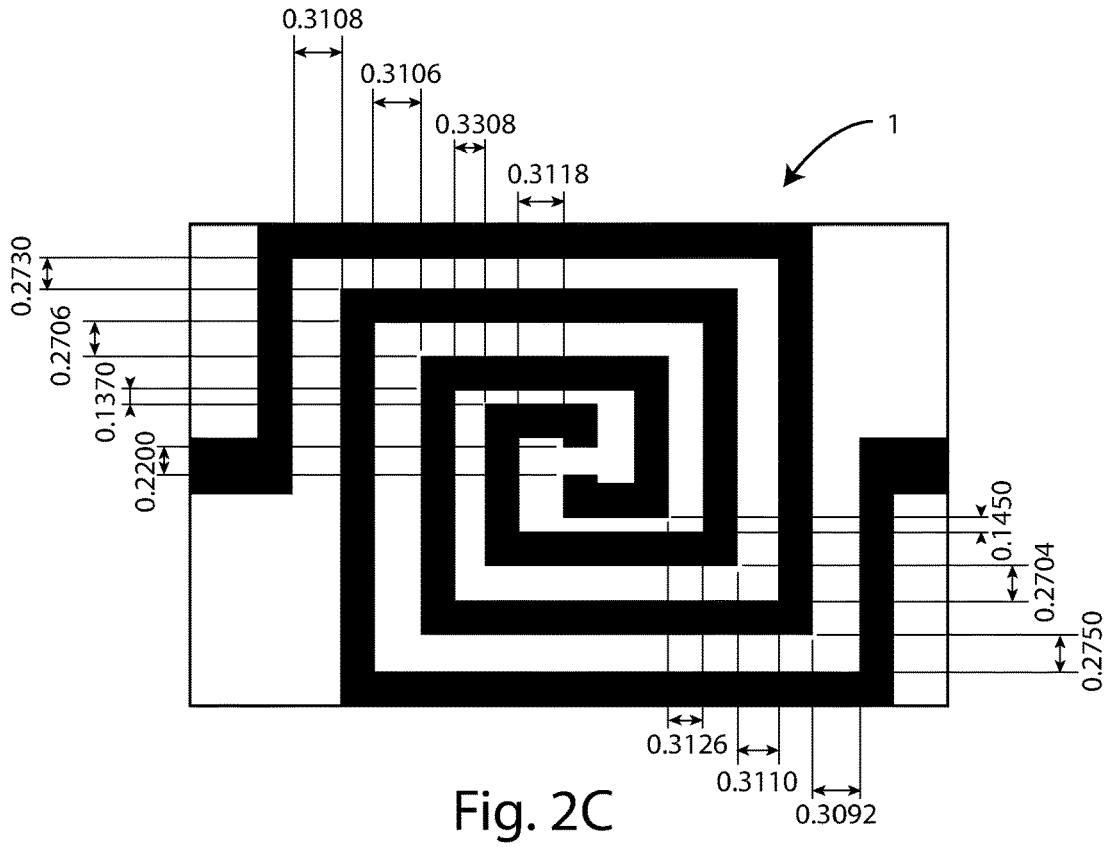
FIG. 2C is a schematic view of antenna of the group of antennas of the converter of FIG. 1, in which the values of the distances between different portions of the two dipoles of the same antenna are shown.

FIG. 2C shows the distances between different portions of the two dipoles of an antenna 1 of the group of antennas, parallel to each other.

All the numerical values shown in FIG. 2C are expressed in μm.

The distances between the dipoles and the dipole thicknesses are chosen in such a way as to create a dielectric capacity between the dipoles to optimize the resonance of the antenna itself.

The distance between the first portion S1 of the first dipole 1A and the third portion of the second dipole 1B is 0.3108 μm.

The distance between the second portion S2 of the first dipole and the fourth portion S4' of the second dipole is 0.7730 μm.

The distance between the third portion S3 of the first dipole 1A and the first portion S1' of the second dipole is 0.3092 μm.

The distance between the third portion S3 of the first dipole 1A and the fifth portion S5' of the second dipole 1B is 0.3110 μm.

The distance between the fourth S4 of the first dipole 1A and the second portion S2' of the second dipole 1B is 0.2750 μm.

The distance between the fourth portion S4 of the first dipole 1A and the sixth portion S6' of the second dipole 1B is 0.2704 μm.

The distance between the fifth portion S5 of the first dipole 1A and the third portion S3' of the second dipole 1B is 0.3106 μm.

The distance between the fifth portion S5 of the first dipole 1A and the seventh portion S7' of the second dipole is 0.3308 μm.

The distance between the sixth S6 of the first dipole 1A and the fourth portion S4' of the second dipole 1B is 0.2706 μm.

The distance between the sixth portion S6 of the first dipole 1A and the eight portion S8' of the second dipole 1B is 0.1370 μm.

The distance between the seventh portion S7 of the first dipole 1A and the fifth portion S5' of the second dipole 1B is 0.3126 μm.

The distance between the eighth portion S8 of the first dipole 1A and the sixth portion S6' of the second dipole 1B is 0.1450 μm.

The distance between the eight portion S8 of the first dipole 1A and the seventh portion S7' of the second dipole 1B is 0.3118 μm.

Figure 3:
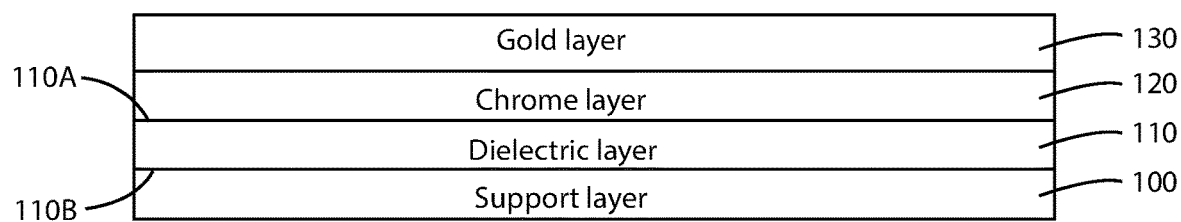
FIG. 3 is a section view showing the layered structure of an antenna of the group of antennas of the converter of FIG. 1.

FIG. 3 shows the layered structure of an antenna 1 of the group of antennas.

Said antenna 1 comprises the following layers arranged in succession from bottom to top:
  a support layer 100,
  a dielectric layer 110
  a reinforcing layer 120 in metal material, preferably in chrome,
  a conductive layer 130 in metal material, preferably in gold.

In particular, the dielectric layer 110 comprises a first surface 110A and a second surface 110B, opposite to said first surface 110A.

The reinforcing layer 120 in chrome is in contact with the first surface 110A of the dielectric layer 110 and the support layer 100 is in contact with the second surface 110B of the dielectric layer.

Lo strato conduttore 130 è in oro perché l'oro è un ottimo conduttore. The conductive layer 130 is made of gold because gold is a great conductor. However, said conductive layer in gold, if subjected to bending, can deform o even break, with the risk to interrupt the passage of electric current. Consequently, the structure of the antenna provides the reinforcing layer 120 in chrome for reinforcing said conductive layer in gold.

It is preferable that said dielectric layer is in silicon dioxide ($SiO_2$).

It is further preferably that said support layer 100 is in polymeric material, such as in polyethylene or polycarbonate.

In particular, said support layer can be in a material selected in the following group: polycarbonate, polyethylene, polyester fabric, cycloolefin copolymers, preferably Topas.

The polymeric material gives the support layer a predetermined degree of flexibility and allows said support layer to constitute the mass of said antenna.

With particular reference to the reinforcing layer 120 and the conductive layer 130, it is preferably that the reinforcing layer 120 is lithographed on the dielectric layer 110 and that the conductive layer 130 is lithographed on the reinforcing layer 120.

Figure 4:
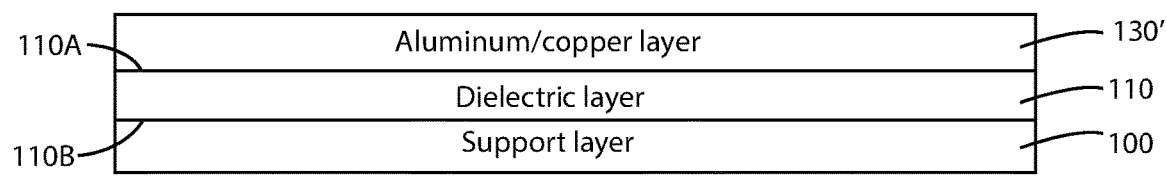
FIG. 4 shows an alternative of the layers structure for an antenna of the group of antennas of the converter of FIG. 1.

In an alternative, shown in FIG. 4, each antenna 1 comprises the following layers arranged in succession from bottom to top:
  a support layer 100,
  a dielectric layer 110,
  a conductive layer 130' in metal material, preferably in aluminum or copper.

In particular, said conductive layer 130' is in contact with the first surface 110A of said dielectric layer 110, and said support layer 100 is in contact with the second surface 110B of said dielectric layer 110.

In other words, in such an alternative, the conductive layer 130 in gold and the reinforcing layer 120 in chrome are not present in the structure of the antenna and are substituted from the conductive layer 130' in aluminum or copper.

The presence of the conductive layer in aluminum or copper allows a reduction of manufacturing costs of the antenna.

With particular reference to the conductive layer 130', it is preferably that said conductive layer 130' is lithographed on the dielectric layer 110.

Figure 5:
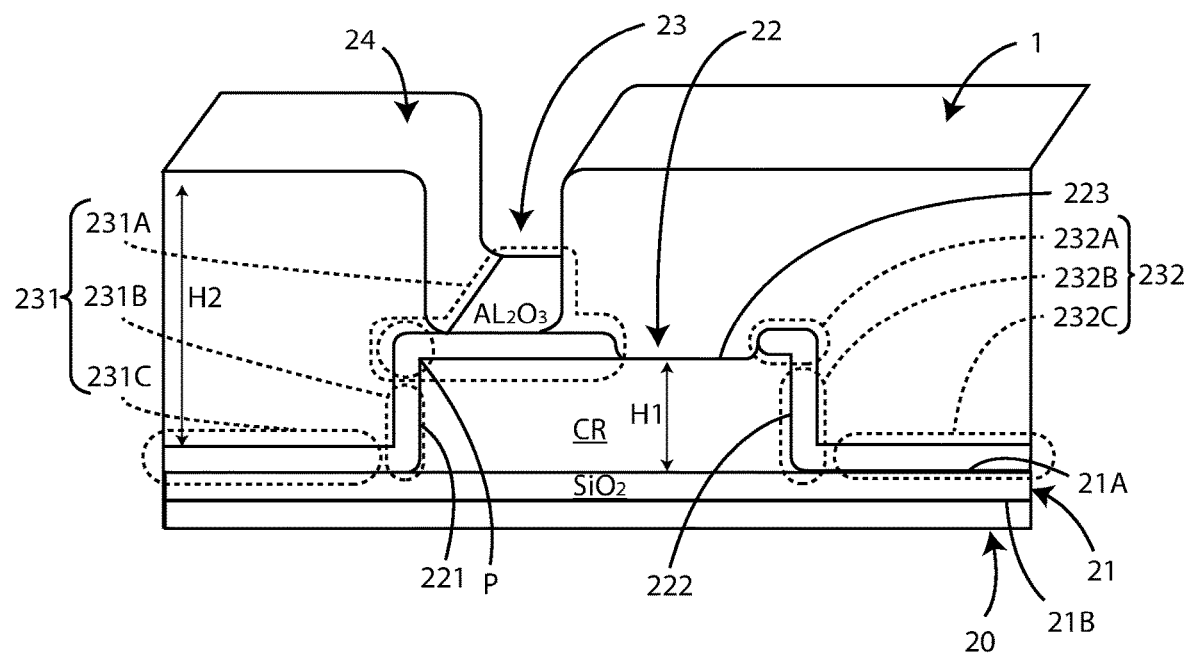
FIG. 5 is a schematic view of the rectifier of the converter.

FIG. 5 is a schematic view of the structure of the rectifier 2 configured for transforming the alternating electric current generated by the group of antennas in a continuous electric current, through which any load connected to said rectifier can be powered.

With reference to the rectifier 2, said rectifier 2 comprises a quantum diode, where said quantum diode comprises:
  a first dielectric layer 21 comprising a first surface 21A and a second surface 21B, opposite to said first surface 21A, where said first dielectric layer 21 has a thickness equal to a quarter of the wavelength of said electromagnetic wave,
  a first electrode or cathode 22 made of a first metal material, different from the metal material of the conductive layer 130 of an antenna 1, where said first electrode 22 is partially in contact with the first surface 21A of said first dielectric layer 21 and partially in contact with said antenna 1,1' (in particular with the first dipole 1A of said antenna 1); in cross section said first electrode 22 having a first height H1 and having a first side 221 with a first end, in contact with the first surface 21A of the first dielectric layer 21, and a second end, opposite to said first end, a second side 222 with a first end in contact with the first surface 21A of the first dielectric layer 21, and a second end, opposite said first end, as well as a third side 223 connecting the second end of said first side 221 to the second end of said second side 222, where said third side 223 has a first end in contact with the second end of said first side 221 in such a way that said first side and said third side have a contact point P, a second dielectric layer 23 comprising a first part 231, where said first part comprises a first portion 231A in contact with a portion of said third side 223 of said first electrode 22 and with a portion of said antenna 1 (in particular with the first dipole 1A of said antenna 1), a second portion 231B in contact with said first side 221 of said first electrode 22, and a third portion 231C in contact with a portion of the first surface 21A of said first dielectric layer 21, a second electrode or anode 24 made of a second metal material, equal to the metal material of the conductive layer of said antenna 1, partially in contact with the first part of said second layer dielectric 23, so that said second electrode 24 is separated from said first electrode 22 by said first part 231 of said second dielectric layer 23; in cross section said second electrode 24 having a second height H2, greater than the first height H1 of said first electrode 22.

In particular, said first side 221 and said third side 223 of the first electrode 22 are arranged in such a way that they form an angle greater than 0° and less than or equal to 90°, so that, when each antenna 1 resonates at the frequency of the electromagnetic wave, a respective quantity of electrons moves from said first electrode 22 to said second electrode 24, jumping for tunnel effect the second dielectric layer 23 in correspondence of said contact point P.

Consequently, such a tunnel effect is a quantum tunnel effect and said quantity of electrons is capable of passing through said second dielectric layer 23 to reach the second electrode 24, without the possibility for such a quantity of electrons to return to the first electrode 22 through a further jump of said second dielectric layer 23.

In high frequency, the jump of said quantity of electrons from the first electrode 22 to the second electrode 24 takes place in a time Δt (of the order of nanoseconds) such that once the second electrode 24 is reached said quantity of electrons continues its unidirectional path.

Advantageously, the quantum diode does not heat up and is more efficient in terms of energy with respect to a junction diode, since said quantum diode dissipates a quantity of heat and an amount of energy which are irrelevant with respect to said junction diode.

It is preferable that said angle be between 5° and 30° to facilitate the passage of electrons from the first electrode 22 to the second electrode 24 in correspondence of a single point, i.e. said contact point P, and reduce the dispersion of electrons, so as to obtain a greater efficiency in the conversion from alternating electric current to continuous electric current.

In the first embodiment being disclosed, said first electrode 22 is partially in contact with the first dipole 1A of the antenna 1, but it could be in contact with the second dipole 1B of the antenna 1, without departing from the scope of the invention.

Furthermore, said dielectric layer 23 comprises a second part 232, spaced from the first part 231, where said second part 232 comprises a first portion 232A in contact with a further a portion of said third side 223 of said first electrode 22, a second portion 232B in contact with said second side 222 of said first electrode 22, a third portion 232C in contact with a further portion of the first surface 21A of said first dielectric layer 21.

The distance between said second part 232 and said first part 231, in particular the distance between the first portion 231A of said first part 231 and the first portion 232 of said second part 232 is between 70 nm and 100 nm.

Furthermore, in the first embodiment being disclosed, the first dielectric layer 21 is made of silicon dioxide ($SiO_2$), the first metal material of which the first electrode 22 is made is chrome, the second dielectric layer 23 is made of dialuminium trioxide ($Al_2O_3$), and the second metal material of which the second electrode 24 is made is gold.

In an alternative, with reference to the second dielectric layer 23, the dialuminium trioxide can be substituted by the hafnium dioxide ($HfO_2$), without departing from the scope of the invention.

Moreover, the thickness of said second dielectric layer is chosen in such a way as to prevent the electrons from returning to the first electrode, after said electrons, moving from the first electrode 22 to the second electrode 24, have reached said second electrode.

The thickness of said dielectric layer 23 can be between 1.5 nm and 4 nm, preferably 2 nm.

As already said, the rectifier 2 comprises a quantum diode for transforming the alternating electric current in a continuous electric current.

In particular, as said, said diode is a quantum diode and has a structure such as to be configured to rectify at high speed the alternating electric current into a continuous electric current This is due to the asymmetry of the structure of the quantum diode and the asymmetry of said structure is given by the difference of metal material between the first electrode 22 and the second electrode 24, and to the difference in height between the first electrode 22 and the second electrode 24.

Furthermore, said quantum diode comprises a support layer 20, arranged in contact with the second surface 21B of said first dielectric layer 21.

In a first alternative, said support layer 20 can have a predetermined degree of flexibility and be in a material selected in the following group: polyethylene, polyester fabric.

In a second alternative, said support layer 20 can have a predetermined degree of rigidity and be in a material selected from the following group: glass, plexiglas.

Figure 6:
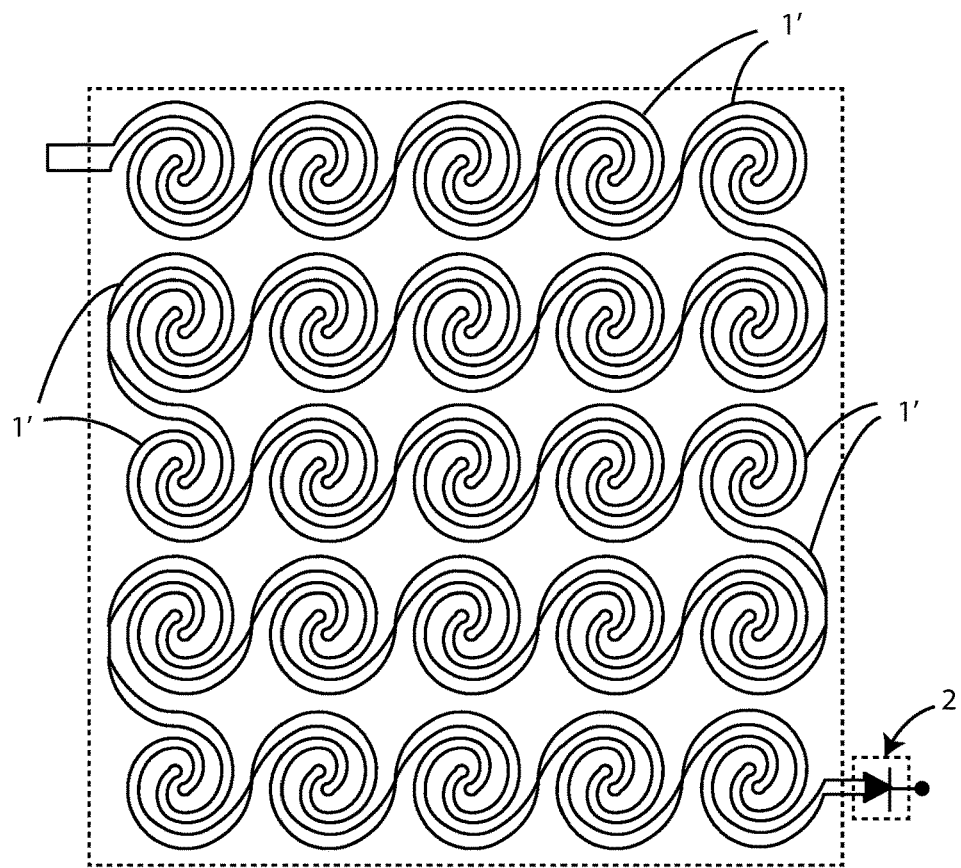
FIG. 6 is a schematic view of a second embodiment of the converter according to the invention, comprising a group of antennas and one rectifier, connected in series to said group pf antennas, where the antennas of said group of antennas are connected in series to each other, each antenna of the group of the antennas is configured to resonate with an electromagnetic wave having a wavelength belonging to the infrared spectrum, the value of which is close to the value of the wavelengths of the visible spectrum.

In a second embodiment of the converter shown n FIG. 6, differently from the first embodiment, each antenna 1 of the group of antenna is configured to resonate with electromagnetic waves belonging to the infrared spectrum and having a wavelength equal to 11.2 μm (frequency approximately equal to 26 THz), where said wavelength has a value close to the wavelengths belonging to the visible spectrum.

In the second embodiment being disclosed, the group of antennas of said converter comprises thirty antennas 1', arranged in accordance with a matrix 5×6, and the rectifier 2 connected in series to the antenna which occupies a position in said matrix identified by the fifth row and the sixth column.

However, it is not necessary either for said group of antennas to comprise thirty antennas, or that the antennas are arranged according to a matrix.

For example, said group of antennas can comprise a plurality of antennas in any number, arranged along an axis so as to form a row, without departing from the scope of the invention.

Each antenna 1' comprises a first dipole 1A' and a second dipole 1B' and has a geometric structure substantially shaped in such a way as to form an elliptical spiral.

In fact, said first dipole 1A' and said second dipole 1B' are bent on themselves and arranged in such a a way as to form an elliptical spiral.

In particular, said first dipole 1A' and said second dipole 1B' have a respective first end 11A',11B' and a respective second end 12A',12B'.

The second end 12B' of the second dipole 1B' of the antenna 1' is facing an end portion of the first dipole 1A', arranged in proximity of the second end 12A' of the first dipole 1A' of the same antenna, and the first end 11B' of the second dipole 1B' of said antenna is connected to the first end 11A' of the first dipole 1A' of a further antenna, arranged in succession, connected in series to said antenna.

Figure 7A:
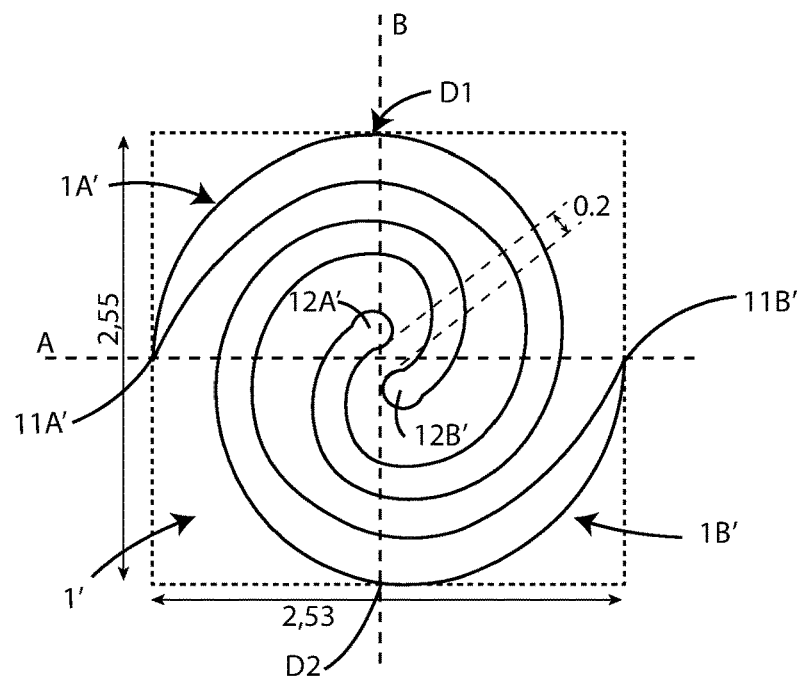
FIG. 7A is a schematic view of an antenna of the group of antennas of the converter of FIG. 6, where said antenna has a shape of a elliptical spiral and comprises a first dipole and a second dipole, in which the value of distance between the first end of the first dipole and the first end of the second dipole, the value of the second end of the first dipole and the second end of the second dipole and the value of the distance between a predetermined first point of a first dipole and a predetermined second point of the second dipole are shown.

FIG. 7A the value of the distance between the first end 11A' of the first dipole 1A' and the first end of the second dipole 11B', the value of the distance between the second end 12A' of the first dipole 1A' and the second end 12B' of the second dipole 1B' and the value of the distance between a predetermined point of the first dipole 1A' and a predetermined point of the second dipole 1B'.

All the numerical values shown in FIG. 7A are expressed in µm.

As shown in FIG. 7A, the distance between the second end 12A' of the first dipole 1A' and the second end 12B' of the second dipole 1B' is 0.2 µm.

The shape of said antenna 1' (comprising said first dipole 1A' and said second dipole 1B') is such that it is inscribed in a rectangle having a base equal to 2.53 µm and a height equal to 2.55 µm.

In particular, the first end 11A' of the first dipole 1A' and the first end 11B' of the second dipole 1B are arranged on a first axis A and the distance between a predetermined first point D1 and a predetermined second point D2 are arranged on a second axis B, perpendicular to said first axis A and passing for the second end of the first dipole 1A', is equal to 2.55 µm.

Figure 7B:
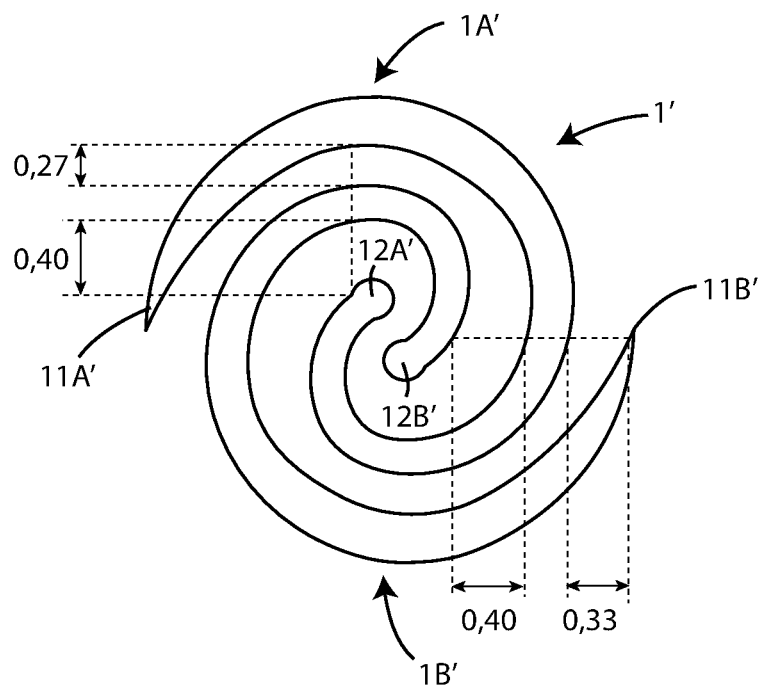
FIG. 7B is a schematic view of an antenna of the group of antennas of the converter of FIG. 6, in which it is shown how to change the distance between the first dipole and the second dipole of the antenna, in a first direction, from the first end of the first dipole to the second end of the first dipole, and how to change the distance between the second dipole and the first dipole of the same antenna, in a second direction, from the first end to the second dipole to the second end of the second dipole.

FIG. 7B shows how to change the distance between the first dipole 1A' and the second dipole 1B' of the antenna 1' in a first direction, from the end 11A' of the first dipole 1A' to the second end 12A' of the first dipole 1A', and how to change the distance between the second dipole 1B' and the first dipole 1A' of the same antenna in a second direction, from the first end 11B' of the second dipole 1B' to the second end of the second dipole 12B'.

All the numerical values in FIG. 7B are expressed in µm.

As can be seen from FIG. 7B, the distance between the first dipole 1A' and the second dipole 1B' increases from a first value equal to 0.27 µm to a second value equal to 0.40 µm in a first direction, from the first end 11A' of the first dipole 1A to the second end 12A' of the first dipole itself.

The distance between the second dipole 1B' and the first dipole 1A' increases from a first value equal to 0.33 µm to a second value equal to 0.40 µm in a second direction, from the first end 11B' of the second dipole 1B' to the second end 12B' of the second dipole itself.

Figure 7C:
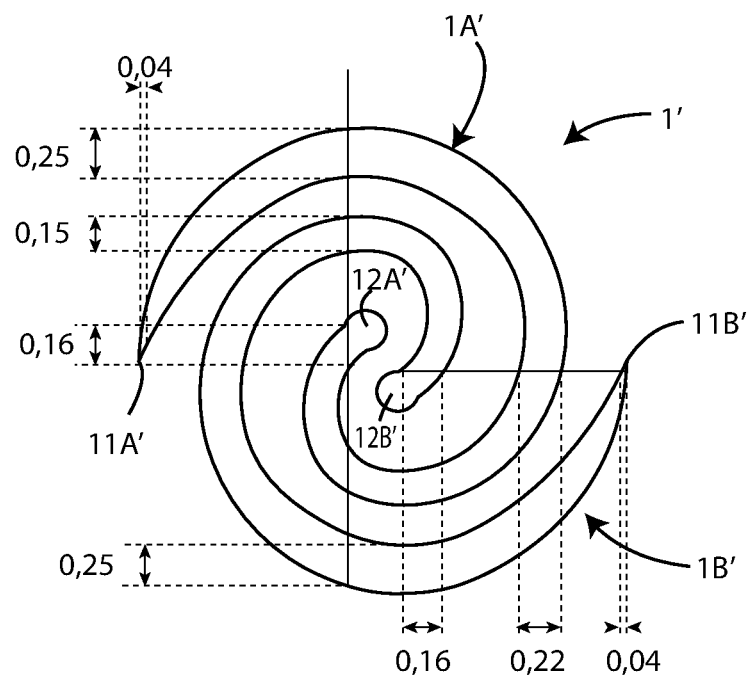
FIG. 7C is a schematic view of an antenna of the group of antennas of the converter of FIG. 6, in which the widths of some portions of the first dipole and the width of some portions of the second dipole are shown.

FIG. 7C shows the widths of some portions of the first dipole 1A' and the widths of some portions of the second dipole 1B' of the antenna 1'.

All the numerical values in FIG. 7C are expressed in µm.

As can be seen from FIG. 7C, the width of the first dipole 1A' increases from the first end 11A' for a predetermined portion and then decreases progressively toward to the second end 12A' of the first dipole itself.

The width of the first dipole 1A' increases from a first value equal to 0.04 µm, substantially at the second end 12A', up to a second value equal to 0.25 µm, substantially at a portion arranged at a one quarter of the first dipole, and then from said second value decreases up to a third value equal to 0.22 µm, substantially at a portion arranged at tree quarters of the first dipole, and from said third value decreases up to a fourth value equal to 0.16 µm, in proximity of the first end 11B of the second dipole 1B'.

The width of the second dipole 1B' increases from a first value equal to 0.004 µm, substantially at the first end 11B', to a second value equal to 0.25 µm, substantially at a portion arranged at a quarter of the second dipole, and then from said second value decreases up to a third value equal to 0.15 µm, substantially at a portion arranged at tree quarter of the second dipole, and from said third value decreases up to a fourth value equal to 0.16 µm, in proximity of the second end 12B' of the second dipole 1B'.

With reference to the embodiments above disclosed, each antenna is preferably carried out by nanotechnology.

Furthermore, it is preferable that the antenna 1,1' is a planar antenna.

Furthermore, the thickness of each antenna can be between 0.3 µm e 0.5 µm and is preferably 0.3 µm in order to the antenna has an impedance with a value greater than the value of the resistance of the quantum diode. In particular, in the embodiments disclosed, with such a thickness it is possible to obtain an impedance with a value equal or substantially equal to 370Ω and the resistance of the quantum diode offered by the dielectric material of the second dielectric layer has a value between 140Ω and 180Ω.

Figure 8:
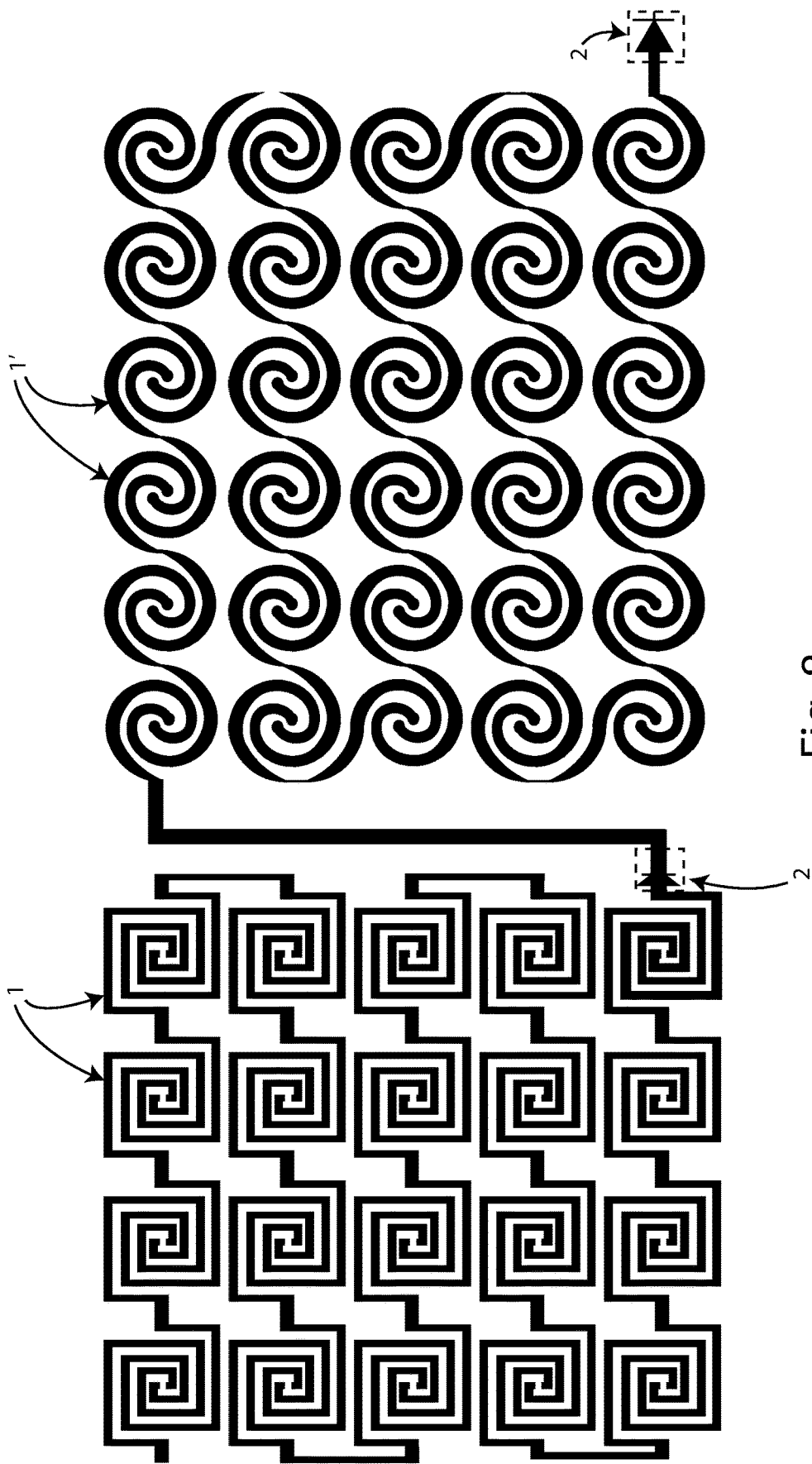
FIG. 8 is a schematic view of a conversion system, where said conversion system comprises two converters connected in series to each other.

FIG. 8 shows a conversion system for converting an electromagnetic wave in a continuous electric current.

Said conversion system comprises a first converter, as disclosed with reference to the first embodiment, and a second converter, as disclosed with reference to the second embodiment, where said second converter is connected in series to the rectifier of the first converter.

However, said conversion system can comprise any number of converters, connected in series to each other and said converters can be also identical to each other, in terms of shape of antennas being part of the respective groups of antennas (for example each converter can have a group of antennas, the antennas of which have the geometric structure of a square spiral, or the geometric structure of a elliptical spiral or each antenna of the group of antennas can comprise only a dipole) and can have the same number of antennas or a number of antennas different to each other.

Advantageously, as already said, the converter, object of the invention, allows to generate a continuous electric current from an electromagnetic natural or artificial wave by means of which it is possible to supply power to any load connected to said converter.

In particular, by means of said converter, it is possible to convert electromagnetic waves with different frequencies in continuous electric current.

Consequently, also the electromagnetic waves generated by the heat of any device capable of gene rating heat, such as a radiator or a motor, can be converted in a continuous electric current.

A second advantage is given by the fact that said converter has a simple structure and consequently a low manufacturing cost, as well as a low installation cost.

A third advantage is given by the fact that said converter is capable of generating a continuous electric current independently from the weather conditions, both day and night.

A fourth advantage is that, when in use in an external environment, said converter does not need to be installed with a predetermined orientation and does not need that moving means are provided for moving said converter depending on the position of the sun, because it is sufficient that the converter picks up electromagnetic waves.

A further advantage is given by the fact that said converter has a light structure having a thickness extremely reduced, as well as it is environmentally friendly.

The present invention has been described for illustrative, but not limitative purposes, according to its preferred embodiment, but it is to be understood that variations and/or modifications can be carried out by a skilled in the art, without departing from the scope thereof, as defined according to enclosed claims.

The invention claimed is:

1. A converter for converting an electromagnetic wave with a wavelength between 1 mm and 400 nm to a continuous electric current, said converter comprising:
   at least one antenna configure to pick up an electromagnetic wave and resonate at the frequency of said electromagnetic wave, so as to generate an alternating electric current having a frequency equal to the frequency of said electromagnetic wave; and
   at least one rectifier for transforming said alternating electric current into a continuous electric current, wherein said at least one rectifier is connected in series to said antenna,
   wherein said antenna comprises:
      a dielectric layer having a thickness equal to one quarter of the wavelength of said electromagnetic wave,
      a conductive layer of metal material; and
   wherein said rectifier comprises a quantum diode, wherein said quantum diode comprises:
      a first dielectric layer comprising a first surface and a second surface, opposite to said first surface, said first dielectric layer having a thickness equal to a quarter of the wavelength of said electromagnetic wave,
      a first electrode or cathode made of a first metal material, different from the metal material of the conductive layer of said antenna, wherein said first electrode is partially in contact with the first surface of said first dielectric layer and partially in contact with said antenna; in cross section said first electrode having a first height and having a first side with a first end, in contact with the first surface of the first dielectric layer, and a second end, opposite to said first end, a second side with a first end in contact with the first surface of the first dielectric layer, and a second end, opposite said first end, and a third side connecting the second end of said first side to the second end of said second side, wherein said third side has a first end in contact with the second end of said first side in such a way that said first side and said third side have a contact point,
      a second dielectric layer comprising a first part, wherein said first part comprises a first portion in contact with a portion of said third side of said first electrode, a second portion in contact with said first side of said first electrode, and a third portion in contact with a portion of the first surface of said first dielectric layer,
      a second electrode or anode made of a second metal material, equal to the metal material of the conductive layer of said antenna, partially in contact with the first part of said second dielectric layer, so as to said second electrode is separated from said first electrode by said first part of said second dielectric layer; in cross section said second electrode having a second height, greater than the first height of said first electrode,
      said first side and said third side are arranged in such a way that they form an angle greater than 0° and less than or equal to 90°, so that each antenna resonates at the frequency of the electromagnetic wave, a respective quantity of electrons moves from said first electrode to said second electrode jumping for tunnel effect said second dielectric layer in correspondence of said contact point.

2. The converter according to claim 1, wherein said angle is between 5° and 30°.

3. The converter according to claim 1, wherein said second dielectric layer has a thickness ranging from 1.5 nm to 4 nm.

4. The converter according to claim 1, wherein said second dielectric layer comprises a second part, spaced from said first part, comprising a first portion in contact with a further portion of said third side of said first electrode, a second portion in contact with said second side of said first electrode, a third portion in contact with a further portion of the first surface of said first dielectric layer.

5. The converter according to claim 4, wherein the distance between said second part and said first part is between 70 nm and 100 nm.

6. The converter according to claim 1, wherein said quantum diode comprises a support layer arranged in contact with the second surface of said first dielectric layer.

7. The converter according to claim 6, wherein said support layer of said quantum diode is made of a material selected from the group consisting of polycarbonate, polyethylene, polyester fabric, cycloolefin copolymers, or Topas.

8. The converter according to claim 6, wherein said support layer is made of a material selected from the group consisting of glass or plexiglass.

9. The converter according to claim 1, wherein:
   said first dielectric layer is made of silicon dioxide,
   said first electrode is made of chrome,
   said second dielectric layer is made of dialuminium trioxide or hafnium dioxide, and
   said second electrode is made of gold.

10. The converter according to claim 1, wherein:
   the dielectric layer of said antenna has a first surface and a second surface, opposite to said first surface,
   wherein said antenna comprises:
      a reinforcing layer, in contact with the first surface of said dielectric layer, said reinforcing layer being made of chrome;
      a support layer, in contact with the second surface of said dielectric layer, and
   wherein said conductive layer is arranged in contact with said reinforcing layer, said conductive layer being made of gold.

11. The converter according to claim 1, wherein:
the dielectric layer of said antenna has a first surface and a second surface opposite to said first surface,
wherein said antenna comprises:
a support layer, in contact with the second surface of said dielectric layer, and
wherein said conductive layer is arranged in contact with the first surface of said dielectric layer, said conductive layer being made of aluminum or copper.

12. The converter according to claim 10, wherein said support layer of said antenna is made of a material selected from the group consisting of polycarbonate, polyethylene, polyester fabric, cycloolefin copolymers, or Topas.

13. The converter according to claim 10, wherein said dielectric layer is made of silicon dioxide.

14. The converter according to claim 1, wherein said antenna comprises a first dipole and a second dipole, said antenna being a planar antenna.

15. The converter according to claim 1, wherein the thickness of said antenna is between 0.3 μm and 0.5 μm.

* * * * *

UNITED STATES PATENT AND TRADEMARK OFFICE
CERTIFICATE OF CORRECTION

PATENT NO. : 11,404,971 B2
APPLICATION NO. : 16/769524
DATED : August 2, 2022
INVENTOR(S) : Cesare Maria Mose Pasquali It is certified that error appears in the above-identified patent and that said Letters Patent is hereby corrected as shown below:

On the Title Page

Page 2, Column 2, item (56) under Other Publications, Line 12, delete "20081;" and insert -- 2008; --.

In the Specification

Column 1, Line 22, delete "ultraviolet)" and insert -- ultraviolet). --.

Column 1, Line 29 (approx.), delete "electromagnectic" and insert -- electromagnetic --.

Column 1, Line 40 (approx.), delete "frequence" and insert -- frequency --.

Column 2, Line 65, delete "electrode," and insert -- electrode. --.

Column 4, Line 8 (approx.), delete "view o fan" and insert -- view of an --.

Column 5, Line 16 (approx.), delete "sto" and insert -- to --.

Column 6, Line 5, delete "portio" and insert -- portion --.

Column 6, Line 17 (approx.), delete "beng" and insert -- being --.

Column 6, Line 24, delete "espresse" and insert -- expressed --.

Column 6, Line 27, delete "μm" and insert -- μm, --.

Column 6, Line 28, delete "μm" and insert -- μm, --.

Column 6, Line 29, delete "μm" and insert -- μm, --.

Signed and Sealed this
Tenth Day of January, 2023

*Katherine Kelly Vidal*
Director of the United States Patent and Trademark Office

CERTIFICATE OF CORRECTION (continued)
U.S. Pat. No. 11,404,971 B2

Column 6, Line 39, delete "μm" and insert -- μm, --.

Column 10, Line 41, delete "current" and insert -- current. --.

Column 11, Line 16 (approx.), delete "a a" and insert -- a --.

Column 12, Line 17 (approx.), delete "tree" and insert -- three --.

Column 12, Line 26, delete "tree" and insert -- three --.